United States Patent
Okude

(10) Patent No.: US 10,284,170 B2
(45) Date of Patent: May 7, 2019

(54) SURFACE ACOUSTIC WAVE FILTER, DUPLEXER, AND MULTIPLEXER

(71) Applicant: Murata Manufacturing Co., Ltd., Nagaokakyo-shi, Kyoto-fu (JP)

(72) Inventor: Takayuki Okude, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 62 days.

(21) Appl. No.: 15/617,014

(22) Filed: Jun. 8, 2017

(65) Prior Publication Data

US 2017/0373666 A1    Dec. 28, 2017

(30) Foreign Application Priority Data

Jun. 24, 2016 (JP) ................. 2016-125561

(51) Int. Cl.
| | |
|---|---|
| *H03H 9/02* | (2006.01) |
| *H03H 9/64* | (2006.01) |
| *H01L 41/047* | (2006.01) |
| *H03H 9/25* | (2006.01) |
| *H03H 9/72* | (2006.01) |

(52) U.S. Cl.
CPC ....... *H03H 9/02818* (2013.01); *H01L 41/047* (2013.01); *H03H 9/02992* (2013.01); *H03H 9/25* (2013.01); *H03H 9/64* (2013.01); *H03H 9/725* (2013.01)

(58) Field of Classification Search
CPC .... H01L 41/047; H03H 9/25; H03H 9/02157; H03H 9/64; H03H 9/725; H03H 9/02818; H03H 9/02992

USPC .................................... 333/133, 195
See application file for complete search history.

(56) References Cited

U.S. PATENT DOCUMENTS

| | | | | |
|---|---|---|---|---|
| 2003/0001696 A1* | 1/2003 | Yoshida | ............... | H03H 3/08 333/193 |
| 2008/0290968 A1* | 11/2008 | Yamamoto | ........... | H03H 9/0222 333/193 |
| 2010/0109801 A1 | 5/2010 | Inoue et al. | | |

(Continued)

FOREIGN PATENT DOCUMENTS

| | | | | |
|---|---|---|---|---|
| EP | 0936735 A2 * | 8/1999 | ......... | H03H 9/02952 |
| JP | 2010-109894 A | 5/2010 | | |

(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

In a surface acoustic wave filter, a parallel arm resonator includes an IDT electrode and reflectors. Comb-shaped electrodes of the IDT electrode each include a busbar electrode and electrode fingers connected thereto, and are arranged so that the electrode fingers of the respective comb-shaped electrodes are alternately located in a propagation direction of a surface acoustic wave. The reflectors are provided on both sides of the IDT electrode portion in the propagation direction of the surface acoustic wave so that reflector electrode fingers are parallel or substantially parallel to the electrode fingers. A distance between the electrode finger and the reflector electrode finger which are proximate to each other is about 10% or more and about 20% or less of a main pitch of the electrode fingers.

20 Claims, 4 Drawing Sheets

(56) References Cited

U.S. PATENT DOCUMENTS

2014/0049340 A1* 2/2014 Inoue .................. H03H 9/25
                                                333/133
2014/0197903 A1   7/2014 Uesaka

FOREIGN PATENT DOCUMENTS

JP   2014-039199 A   2/2014
WO   2013/046892 A1  4/2013

* cited by examiner

FIG. 3

| | A | B | C | D | E | F | G | H | I |
|---|---|---|---|---|---|---|---|---|---|
| MAIN PITCH $\lambda_{IDT}$ [μm] | 4.303 | 4.303 | 4.303 | 4.303 | 4.303 | 4.303 | 4.303 | 4.303 | 4.303 |
| DISTANCE X [μm] | 1.129 | 1.043 | 0.957 | 0.871 | 0.785 | 0.699 | 0.613 | 0.527 | 0.441 |
| $X/\lambda_{IDT}$ [%] | 26.2 | 24.2 | 22.2 | 20.2 | 18.2 | 16.2 | 14.2 | 12.2 | 10.2 | ns
SURFACE ACOUSTIC WAVE FILTER, DUPLEXER, AND MULTIPLEXER

CROSS REFERENCE TO RELATED APPLICATIONS

This application claims the benefit of priority to Japanese Patent Application No. 2016-125561 filed on Jun. 24, 2016. The entire contents of this application are hereby incorporated herein by reference.

BACKGROUND OF THE INVENTION

1. Field of the Invention

The present invention relates to a surface acoustic wave filter including resonators, a duplexer, and a multiplexer.

2. Description of the Related Art

Hitherto, there has been developed a branching device in which a reception frequency band is located on a higher side relative to a transmission frequency band (see, for example, International Publication No. 2013/046892).

The branching device described in International Publication No. 2013/046892 is a duplexer including a ladder transmission filter having a plurality of series arm resonators and a plurality of parallel arm resonators. In the transmission filter, the parallel arm resonators include a first resonator having a resonant frequency which is lower than the resonant frequency of the series arm resonators, and a second resonator having a resonant frequency which is higher than the resonant frequency of the series arm resonators and an electrostatic capacity which is lower than the electrostatic capacities of the series arm resonators and the other parallel arm resonators. By setting the resonant frequency of the second resonator to be higher than the resonant frequency of the ladder transmission filter, isolation characteristics within a wide-side bandpass area of the transmission filter are improved.

In a related-art branching device, a high-frequency-suppression trap is provided for a frequency at which the signal level is desired to be decreased, and attenuation characteristics are made appropriate and a desired signal level is secured within the band of the branching device. In this branching device, however, there may arise so-called rebounding of the signal level, in which the attenuation characteristics become deteriorated at a frequency outside the band which is different from the frequency to be suppressed by the trap. Thus, a problem arises in that the filter characteristics become deteriorated.

SUMMARY OF THE INVENTION

In view of the problem described above, preferred embodiments of the present invention provide a surface acoustic wave filter, a duplexer, and a multiplexer that are capable of improving attenuation characteristics outside a band of the surface acoustic wave filter while maintaining appropriate attenuation characteristics within the band.

A surface acoustic wave filter according to a preferred embodiment of the present invention includes at least one series arm resonator and at least one parallel arm resonator. The at least one parallel arm resonator includes an interdigital transducer (IDT) electrode portion including a pair of comb-shaped electrodes, and reflectors provided on both sides of the IDT electrode portion. The pair of comb-shaped electrodes of the IDT electrode portion each include a busbar electrode and a plurality of first electrode fingers that are connected to the busbar electrode and are parallel or substantially parallel to each other, and are arranged so that the first electrode fingers of one of the pair of comb-shaped electrodes and the first electrode fingers of another one of the pair of comb-shaped electrodes are alternately located in a propagation direction of a surface acoustic wave. The reflectors each include a plurality of second electrode fingers that are parallel or substantially parallel to each other, and are provided on both sides of the IDT electrode portion in the propagation direction of the surface acoustic wave so that the second electrode fingers are parallel or substantially parallel to the first electrode fingers. A distance between the first electrode finger and the second electrode finger which are proximate to each other is about 10% or more and about 20% or less of a main pitch of the first electrode finger, for example.

Thus, the signal level at a specific frequency is sufficiently decreased and a desired signal level secured within the transmission band or the reception band of the surface acoustic wave filter. In addition, the so-called rebounding of the signal level, which is caused by suppressing the signal level at the specific frequency, is able to be reduced outside the band. Thus, the attenuation characteristics outside the band of the surface acoustic wave filter are able to be improved while maintaining appropriate attenuation characteristics within the band. Accordingly, it is possible to reduce the occurrence of a case in which unwanted noise is contained in a transmission signal and to reduce the influence of unwanted noise when the unwanted noise is contained in a reception signal.

The at least one parallel arm resonator may be a trap that provides an attenuation pole at a frequency outside a band of the surface acoustic wave filter.

Thus, by using the at least one parallel arm resonator as a trap, the attenuation characteristics outside the band are able to be improved while maintaining appropriate attenuation characteristics within the band without using another element.

The series arm resonator and the parallel arm resonator may define a ladder filter.

Thus, in the ladder filter to be used as a transmission-side filter that is required to have low loss characteristics, the loss characteristics within the band is able to be made more appropriate by improving the attenuation characteristics outside the band. Accordingly, it is possible to reduce the occurrence of a case in which unwanted noise is contained in a transmission signal.

A duplexer according to a preferred embodiment of the present invention includes a surface acoustic wave filter including the features described above.

Thus, it is possible to provide a duplexer capable of improving the attenuation characteristics outside the band while maintaining appropriate attenuation characteristics within the band. Accordingly, in the duplexer including both of the transmission-side filter and the reception-side filter, it is possible to improve the attenuation characteristics of the transmission-side filter and to reduce the deterioration of the attenuation characteristics, which is caused by intrusion of a signal from the reception-side filter into the transmission-side filter. That is, it is possible to reduce the influence of unwanted noise contained in a reception signal and to further reduce the occurrence of a case in which unwanted noise is contained in a transmission signal.

A multiplexer according to a preferred embodiment of the present invention includes the surface acoustic wave filter including the features described above.

Thus, in the multiplexer that performs transmission, reception, or both of transmission and reception of signals in a plurality of frequency bands, the attenuation characteristics outside the bands are able to be improved while maintaining appropriate attenuation characteristics within the bands. Accordingly, it is possible to reduce the occurrence of a case in which unwanted noise is contained in a transmission signal and to reduce the influence of unwanted noise when the unwanted noise is contained in a reception signal.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a plan view and FIG. 2B is a schematic sectional view taken along the chain line in FIG. 2A.

FIG. 3 is a diagram illustrating distances between an IDT electrode portion and a reflector relative to a main pitch of the IDT electrode portion in the surface acoustic wave filter according to a preferred embodiment of the present invention.

DETAILED DESCRIPTION OF THE PREFERRED EMBODIMENTS

Figure 1:
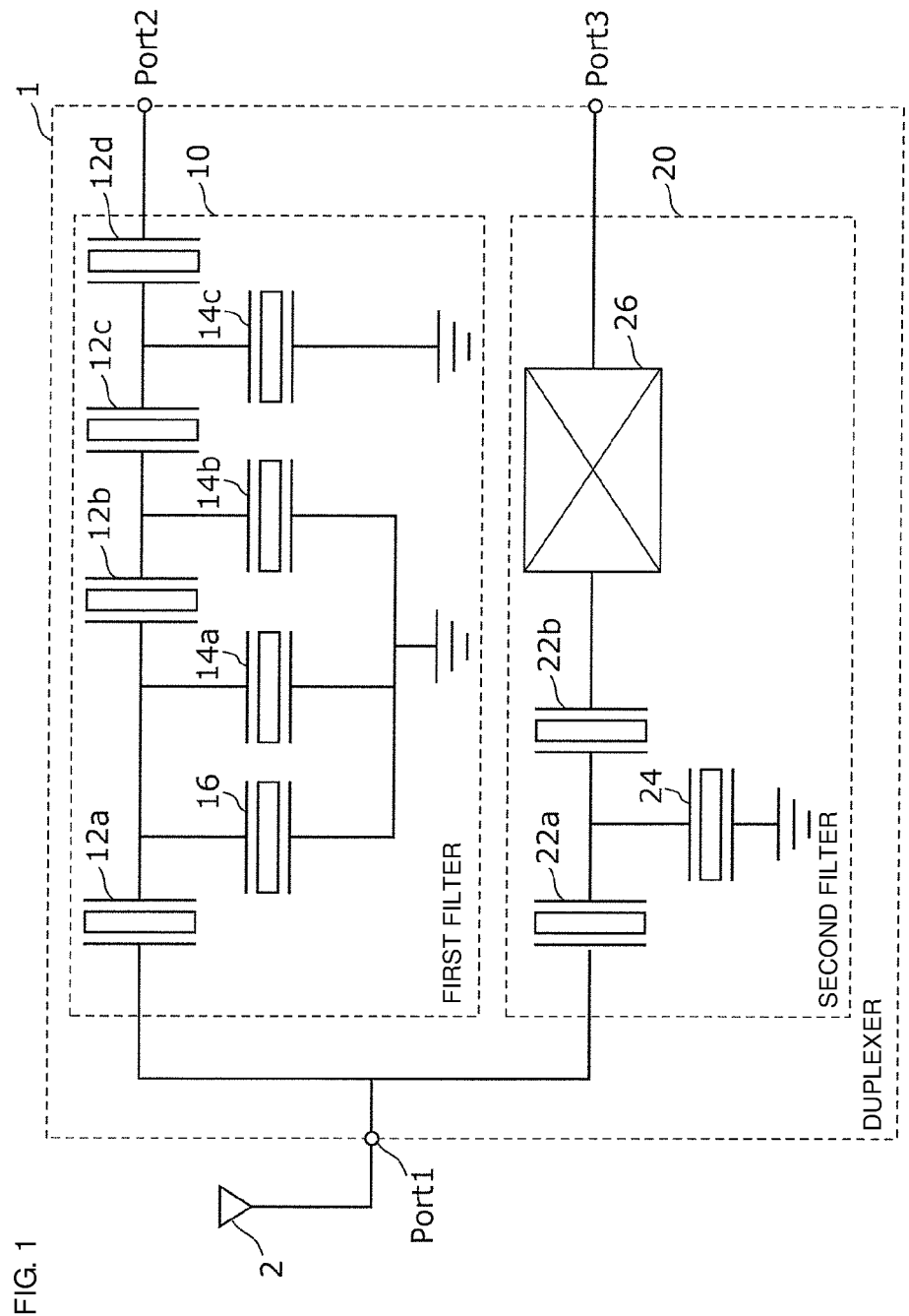
FIG. 1 is a conceptual diagram illustrating the structure of a duplexer according to a preferred embodiment of the present invention.
Figure 2:
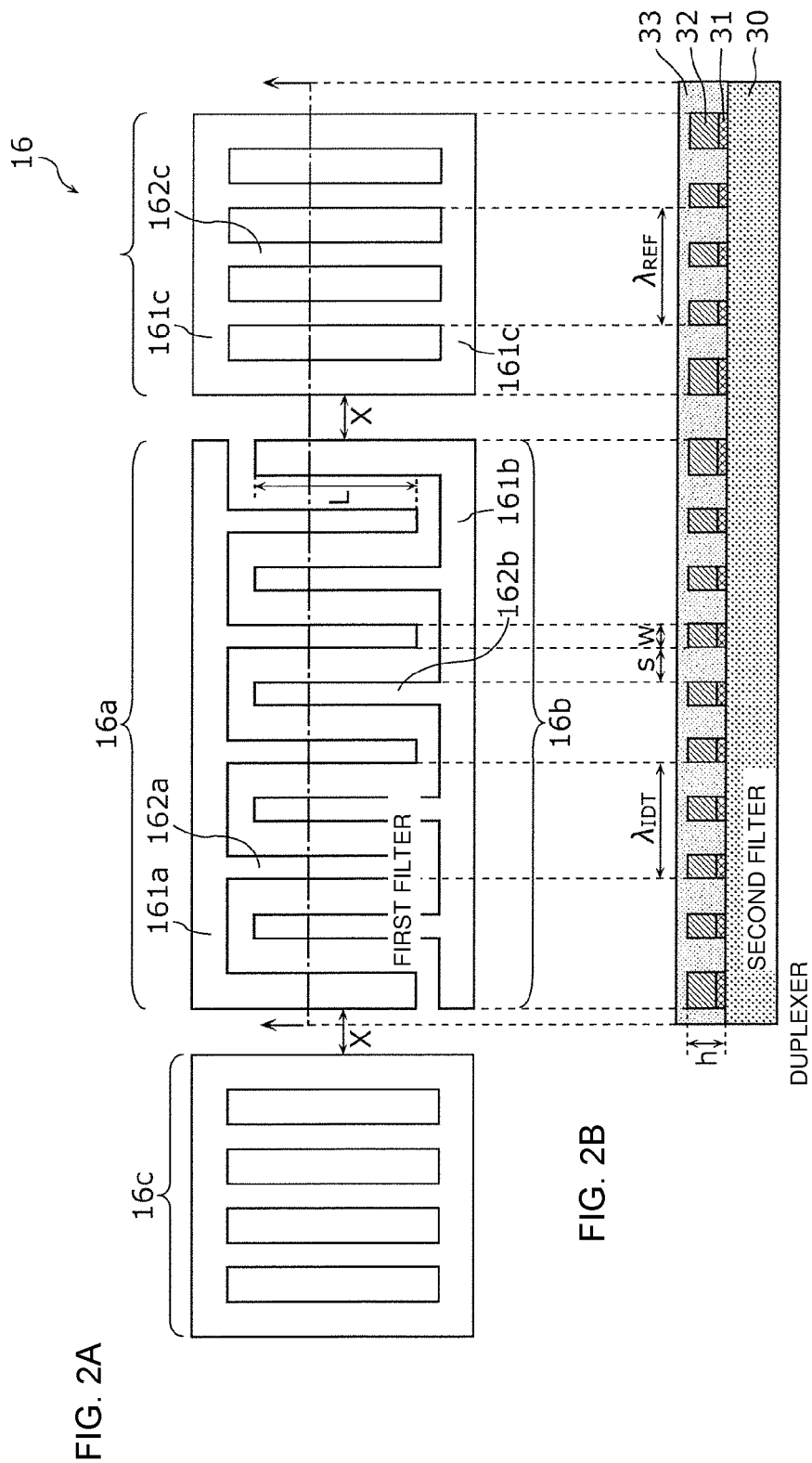
FIGS. 2A and 2B are schematic views illustrating the structure of a parallel arm resonator defining and functioning as a trap in a surface acoustic wave filter according to a preferred embodiment of the present invention, where

Preferred embodiments of the present invention are described below. Each of the preferred embodiments described below describes a preferred and specific example of the present invention. Therefore, numerical values, shapes, materials, constituent elements, arrangement positions and connections of the constituent elements, and the like described in the following preferred embodiments are examples and the present invention is not limited thereto. Thus, among the elements and features of the following preferred embodiments, elements and features which are not described in the independent claims that demonstrate the broadest concept of the present invention are described as optional elements or features.

The drawings are schematic drawings and are not necessarily accurate illustrations. In the drawings, the same or substantially the same components are denoted by the same reference symbols and redundant description thereof is omitted or simplified.

Preferred embodiments of the present invention are described below with reference to FIG. 1 to FIG. 4B.

First, the structure of a duplexer 1 according to a preferred embodiment of the present invention is described. FIG. 1 is a schematic diagram illustrating the structure of the duplexer 1 according to the present preferred embodiment.

The duplexer 1 is, for example, a duplexer configured such that a surface acoustic wave within a frequency band of about 700 MHz to about 3 GHz, for example, is allowed to pass therethrough.

As illustrated in FIG. 1, the duplexer 1 is connected to an antenna 2 at Port 1. The duplexer 1 includes a first filter 10 and a second filter 20. The first filter 10 corresponds to a surface acoustic wave filter according to a preferred embodiment of the present invention.

The first filter 10 is provided between Port 1 and Port 2. The first filter 10 includes series arm resonators 12a, 12b, 12c, and 12d and parallel arm resonators 14a, 14b, 14c, and 16 on a piezoelectric substrate 30 (see FIG. 2B).

The series arm resonators 12a, 12b, 12c, and 12d are connected in series between Port 1 and Port 2. The parallel arm resonator 14a is connected between a connection point of the series arm resonators 12a and 12b and a reference terminal (ground). The parallel arm resonator 14b is connected between a connection point of the series arm resonators 12b and 12c and the reference terminal (ground). The parallel arm resonator 14c is connected between a connection point of the series arm resonators 12c and 12d and the reference terminal (ground). The parallel arm resonator 16 is connected between a connection point of the series arm resonators 12a and 12b and the reference terminal (ground). The parallel arm resonators 14a, 14b, 14c, and 16 are connected together in parallel. Thus, the first filter 10 is a ladder filter in which a pair of the series arm resonator 12a and the parallel arm resonator 16, a pair of the series arm resonator 12b and the parallel arm resonator 14a, a pair of the series arm resonator 12c and the parallel arm resonator 14b, and a pair of the series arm resonator 12d and the parallel arm resonator 14c are continuously connected between Port 1 and Port 2. In this case, the parallel arm resonator 16 is used as a trap. The trap refers to an element that generates an attenuation pole in an insertion loss waveform of a signal at a desired frequency. That is, the trap refers to an element that sets an infinite insertion loss at a desired frequency. The structure of the trap is described later in detail.

The first filter 10 is used as, for example, a transmission-side filter. Port 2 to which the first filter 10 is connected to another transmission-side circuit.

The second filter 20 is provided between Port 1 and Port 3. The second filter 20 includes series arm resonators 22a and 22b, a parallel arm resonator 24, and a longitudinally coupled filter 26 on the piezoelectric substrate 30 (see FIG. 2B). The series arm resonators 22a and 22b and the longitudinally coupled filter 26 are connected in series between Port 1 and Port 3. The parallel arm resonator 24 is connected between a connection point of the series arm resonators 22a and 22b and the reference terminal (ground). Although the illustration is omitted, the longitudinally coupled filter 26 includes a plurality of stages of resonators arranged in a signal propagation direction. The resonators in odd-numbered stages are connected together in parallel and the resonators in even-numbered stages are also connected together in parallel.

The second filter 20 is used as, for example, a reception-side filter. Port 3 to which the second filter 20 is connected to another reception-side circuit.

As described later in detail, each of the series arm resonators 12a, 12b, 12c, and 12d and the parallel arm resonators 14a, 14b, 14c, and 16 is defined by an interdigital transducer (IDT) electrode portion and reflectors provided on both sides of the IDT electrode portion. The structures of the series arm resonators 12a, 12b, 12c, and 12d and the parallel arm resonators 14a, 14b, and 14c are similar to each other. The structure of the parallel arm resonator 16 is similar to the structures of the series arm resonators 12a, 12b, 12c, and 12d and the parallel arm resonators 14a, 14b, and 14c except that the distance between the IDT electrode portion and the reflector is limited to a predetermined value. Therefore, the structure of the resonator is described below taking the structure of the parallel arm resonator 16 as an example.

Next, the structure of the resonator is described. The description is provided taking the parallel arm resonator 16 as an example. FIGS. 2A and 2B are schematic views illustrating the structure of the parallel arm resonator 16 defining and functioning as a trap in the surface acoustic wave filter according to this preferred embodiment, where FIG. 2A is a plan view and FIG. 2B is a schematic sectional view taken along the chain line in FIG. 2A.

As illustrated in FIGS. 2A and 2B, the parallel arm resonator 16 is defined by an IDT electrode portion and reflectors 16c that are provided on the piezoelectric substrate 30. The IDT electrode portion includes comb-shaped electrodes 16a and 16b.

The piezoelectric substrate 30 is preferably made of, for example, a single crystal of $LiNbO_3$ which is cut at predetermined cut-angles. On the piezoelectric substrate 30, a surface acoustic wave propagates in a predetermined direction.

As illustrated in FIG. 2A, the pair of comb-shaped electrodes 16a and 16b that face each other is provided on the piezoelectric substrate 30. The comb-shaped electrode 16a is defined by a plurality of electrode fingers 162a that are parallel or substantially parallel to each other and a busbar electrode 161a that connects the plurality of electrode fingers 162a together. The comb-shaped electrode 16b is defined by a plurality of electrode fingers 162b that are parallel or substantially parallel to each other and a busbar electrode 161b that connects the plurality of electrode fingers 162b together. The comb-shaped electrode 16a and the comb-shaped electrode 16b are constructed such that the electrode fingers 162a and the electrode fingers 162b are alternately arranged in the propagation direction of the surface acoustic wave on the IDT electrode portion. Each of the electrode fingers 162a and 162b corresponds to a first electrode finger according to a preferred embodiment of the present invention.

As illustrated in FIG. 2B, each of the comb-shaped electrode 16a and the comb-shaped electrode 16b has a structure in which a close contact layer 31 and a main electrode layer 32 are laminated.

The close contact layer 31 increases the degree of close contact between the piezoelectric substrate 30 and the main electrode layer 32. As a material for the close contact layer 31, for example, NiCr preferably is used. The film thickness of the close contact layer 31 preferably is, for example, about 10 nm.

As materials for the main electrode layer 32, for example, Al laminated films containing Pt and Cu at about 1% are used and the film thicknesses thereof are, for example, about 93 nm and about 177 nm, respectively. Thus, the manufacturing process is able to be simplified and therefore cost reduction is able to be achieved.

The reflector 16c is defined by a plurality of reflector electrode fingers 162c that are parallel or substantially parallel to each other and reflector busbar electrodes 161c that connect the ends of the plurality of reflector electrode fingers 162c on one side together and also connect the ends of the plurality of reflector electrode fingers 162c on the other side together. Similarly to the comb-shaped electrode 16a and the comb-shaped electrode 16b described above, as illustrated in FIG. 2B, the reflector 16c has a structure in which the close contact layer 31 and the main electrode layer 32 are laminated. The reflector electrode finger 162c corresponds to a second electrode finger according to a preferred embodiment of the present invention.

As illustrated in FIG. 2A, the reflectors 16c are provided on both sides of the IDT electrode portion in the propagation direction of the surface acoustic wave. Specifically, the reflectors 16c are provided on both sides of the IDT electrode portion so that the reflector electrode fingers 162c of the reflectors 16c are parallel or substantially parallel to the electrode fingers 162a and 162b of the IDT electrode portion.

Design parameters of the comb-shaped electrodes 16a and 16b and the reflector 16c are described. In the surface acoustic wave resonator, a wave length is defined by a repetitive pitch of the plurality of electrode fingers 162a and 162b of the comb-shaped electrodes 16a and 16b. The repetitive pitch of the electrode fingers 162a and 162b is referred to as a main pitch $\lambda_{IDT}$. Specifically, as illustrated in FIG. 2B, the main pitch $\lambda_{IDT}$ is a distance from one end side of one electrode finger 162a out of the plurality of electrode fingers 162a of the comb-shaped electrode 16a that are provided at predetermined intervals to one end side of another electrode finger 162a which is adjacent to the one electrode finger 162a. The main pitch $\lambda_{IDT}$ may be a distance from one end side of one electrode finger 162b out of the plurality of electrode fingers 162b of the comb-shaped electrode 16b that are provided at predetermined intervals to one end side of another electrode finger 162b which is adjacent to the one electrode finger 162b.

As illustrated in FIG. 2A, an intersecting width L of the comb-shaped electrodes 16a and 16b is an electrode finger length by which the electrode finger 162a of the comb-shaped electrode 16a and the electrode finger 162b of the comb-shaped electrode 16b overlap each other. The number of pairs is the number of electrode fingers 162a or 162b.

A duty ratio of the IDT electrode is a ratio of the electrode fingers 162a and 162b to the main pitch $\lambda_{IDT}$ of the electrode fingers 162a and 162b. More specifically, as illustrated in FIG. 2B, the duty ratio of the comb-shaped electrodes 16a and 16b is expressed by W/(W+S), where W represents a width of each of the electrode fingers 162a and 162b of the comb-shaped electrodes 16a and 16b and S represents a distance between the electrode finger 162a and the electrode finger 162b. The duty ratio W/(W+S) of the IDT electrode preferably is, for example, about 0.5.

As illustrated in FIG. 2B, a main pitch $\lambda_{REF}$ of the reflector 16c is a distance from one end side of one reflector electrode finger 162c out of the plurality of reflector electrode fingers 162c of the reflector 16c that are provided at predetermined intervals to one end side of another reflector electrode finger 162c which is adjacent to the one reflector electrode finger 162c.

A distance X between the IDT electrode portion and the reflector 16c is a distance between the reflector electrode finger 162c which is proximate to the IDT electrode portion and the electrode finger 162a or 162b which is proximate to the reflector 16c. Specifically, in the reflector 16c which is located on the left side of the IDT electrode portion in FIG. 2A, the distance X between the IDT electrode portion and the reflector 16c is a distance between the electrode finger 162a of the IDT electrode portion which is proximate to the reflector 16c and the reflector electrode finger 162c which is proximate to the electrode finger 162a of the IDT electrode portion. In the reflector 16c which is located on the right side of the IDT electrode portion, the distance X between the IDT electrode portion and the reflector 16c is a distance between the electrode finger 162b of the IDT electrode portion which is proximate to the reflector 16c and the reflector electrode finger 162c which is proximate to the electrode finger 162b of the IDT electrode portion.

In general, the distance X between the IDT electrode portion and the reflector 16c is set equal or substantially equal to the distance S between the electrode finger 162a and the electrode finger 162b so as to provide continuity to signal propagation. Assuming that the width W of each of the electrode finger 162a and the electrode finger 162b is equal or substantially equal to the distance S between the electrode finger 162a and the electrode finger 162b, the distance S between the electrode finger 162a and the electrode finger 162b is, for example, about 0.25 $\lambda_{IDT}$. That is, the distance X between the IDT electrode portion and the reflector 16c preferably is set to about 0.25 $\lambda_{IDT}$, for example.

In the surface acoustic wave filter according to this preferred embodiment, the distance X between the IDT electrode portion and the reflector 16c is preferably set to about 10% or more and about 20% or less of the main pitch $\lambda_{IDT}$ of the IDT electrode portion, for example. The distance X between the IDT electrode portion and the reflector 16c is described later in detail.

As illustrated in FIG. 2B, the comb-shaped electrodes 16a and 16b and the reflectors 16c are covered with a protective layer 33. The protective layer 33 protects the main electrode layer 32 from external environment, adjusting frequency-temperature characteristics, improving moisture resistance, and for other purposes. The protective layer 33 is, for example, a film containing a silicon dioxide as a main component. The film thickness of the protective layer 33 preferably is, for example, about 25 nm.

The materials of the close contact layer 31, the main electrode layer 32, and the protective layer 33 are not limited to the materials described above. Further, each of the comb-shaped electrodes 16a and 16b and the reflector 16c need not have the laminated structure described above. Each of the comb-shaped electrodes 16a and 16b and the reflector 16c may be made of a metal or alloy of, for example, Ti, Al, Cu, Pt, Au, Ag, and Pd, or may also be made of a plurality of multilayer bodies composed of the metal or alloy described above. Further, the protective layer 33 is not necessarily provided.

The structure of the parallel arm resonator 16 is not limited to the structure illustrated in FIG. 2A and FIG. 2B. For example, each of the comb-shaped electrodes 16a and 16b and the reflector 16c may include a single layer of a metal film instead of the laminated structure of metal films.

The material for the piezoelectric substrate 30 is not limited to a single crystal of LiTaO$_3$ or LiNbO$_3$ which is cut at predetermined cut-angles and may be another material. In this case, the piezoelectric substrate 30 may be made of one kind of material or may have a structure in which a plurality of layers composed of different materials are laminated. For example, the piezoelectric substrate 30 may have a structure in which a low acoustic velocity film and a high acoustic velocity film are laminated on a piezoelectric layer in this order. In this case, a silicon film having a film thickness of about 125 μm and a film having a film thickness of about 670 nm, for example, and containing a silicon dioxide as a main component may be used as the low acoustic velocity film and the high acoustic velocity film, respectively. With this structure, the resonant frequency and the quality factor at the resonant frequency is able to be increased compared with the case in which the piezoelectric substrate 30 defined by a single layer is used. By using the surface acoustic wave resonator having a high quality factor, a filter having a small insertion loss is provided.

The structures of the series arm resonators 12a, 12b, 12c, and 12d and the parallel arm resonators 14a, 14b, and 14c preferably are the same or substantially the same as the structure of the parallel arm resonator 16. In the series arm resonators 12a, 12b, 12c, and 12d and the parallel arm resonators 14a, 14b, and 14c, however, the distance X between the IDT electrode portion and the reflector 16c is not limited to about 10% or more and about 20% or less of the main pitch $\lambda_{IDT}$ of the IDT electrode portion, for example. Detailed description of the structures of the series arm resonators 12a, 12b, 12c, and 12d and the parallel arm resonators 14a, 14b, and 14c is omitted.

Figure 4A:
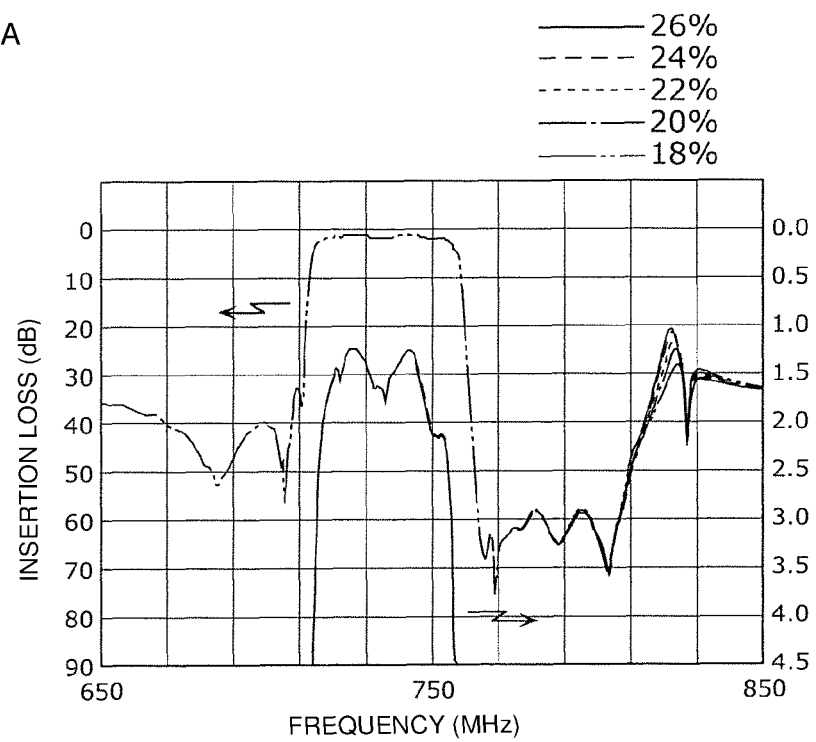
FIG. 4A is a diagram illustrating bandpass characteristics of the surface acoustic wave filter according to a preferred embodiment of the present invention.
Figure 4B:
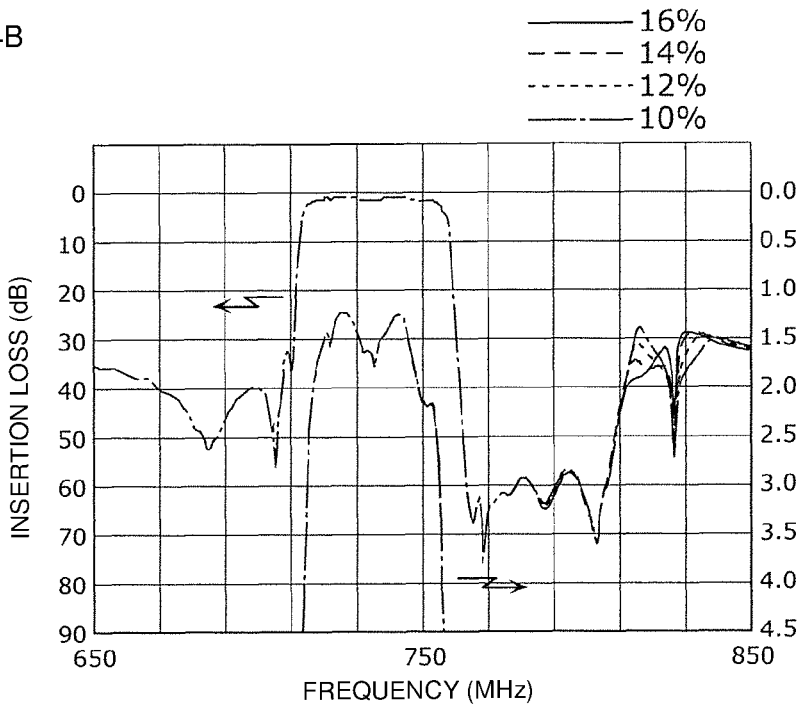
FIG. 4B is a diagram illustrating bandpass characteristics of the surface acoustic wave filter according to a preferred embodiment of the present invention.

Next, bandpass or transmission characteristics of the first filter 10 that is a ladder filter are described with reference to simulation results. FIG. 3 is a diagram illustrating the distances X between the IDT electrode portion and the reflector 16c relative to the main pitch $\lambda_{IDT}$ of the IDT electrode portion in the surface acoustic wave filter according to this preferred embodiment. FIG. 4A and FIG. 4B are diagrams illustrating the bandpass characteristics of the first filter 10 according to this preferred embodiment.

As illustrated in FIG. 3, the distances X between the IDT electrode portion and the reflector 16c relative to the main pitch $\lambda_{IDT}$ of the IDT electrode portion are set as Items A to I. Specifically, for example, the main pitch $\lambda_{IDT}$ of the IDT electrode portion preferably is set to about 4.303 μm and the distances X between the IDT electrode portion and the reflector 16c are preferably set to A: about 1.129 μm, B: about 1.043 μm, C: about 0.957 μm, D: about 0.871 μm, E: about 0.785 μm, F: about 0.699 μm, G: about 0.613 μm, H: about 0.527 μm, and I: about 0.411 μm. In this case, ratios X/$\lambda_{IDT}$ of the distances X between the IDT electrode portion and the reflector 16c to the main pitch $\lambda_{IDT}$ of the IDT electrode portion are, for example, preferably A: about 26.2%, B: about 24.2%, C: about 22.2%, D: about 20.2%, E: about 18.2%, F: about 16.2%, G: about 14.2%, H: about 12.2%, and I: about 10.2%. FIG. 4A and FIG. 4B illustrate the ratios X/$\lambda_{IDT}$ as, for example, A: about 26%, B: about 24%, C: about 22%, D: about 20%, E: about 18%, F: about 16%, G: about 14%, H: about 12%, and I: about 10% by discarding all digits to the right of the decimal point.

FIGS. 4A and 4B illustrate the bandpass characteristics of Items A to I. As illustrated in FIGS. 4A and 4B, by providing the parallel arm resonator 16, the insertion loss is increased near a frequency of about 770 MHz outside the band of the surface acoustic wave filter, but a decrease in the insertion loss (so-called rebounding) is observed near a frequency of about 815 MHz, for example. Regarding the rebounding, attenuation increases as the ratio X/$\lambda_{IDT}$ of the distance X between the IDT electrode portion and the reflector 16c decreases from Item A to Item I. It is recognized that the rebounding is reduced so that the insertion loss becomes equal or substantially equal to an insertion loss at a frequency near the frequency of interest.

As illustrated in FIG. 4A, when the ratio X/$\lambda_{IDT}$ of the distance X between the IDT electrode portion and the reflector 16c to the main pitch $\lambda_{IDT}$ of the IDT electrode portion preferably is, for example, A: about 26%, B: about 24%, or C: about 22%, trouble arises in that the rebounding becomes excessive. When the ratio X/$\lambda_{IDT}$ of the distance X between the IDT electrode portion and the reflector 16c to the main pitch $\lambda_{IDT}$ of the IDT electrode portion is preferably less than, for example, I: about 10%, the distance X between the IDT electrode portion and the reflector 16c is shorter than a limit manufacturable distance and the manufacture may result in failure.

Therefore, in order to reduce the rebounding so that the insertion loss becomes equal or substantially equal to an insertion loss at a frequency near the frequency of interest and to reliably provide the IDT electrode portion and the reflector 16c so that a clearance is secured between the IDT electrode portion and the reflector 16c, the distance X between the IDT electrode portion and the reflector 16c is preferably set to about 10% or more and about 20% or less of the main pitch $\lambda_{IDT}$ of the IDT electrode portion, for example.

As described above, in the surface acoustic wave filter according to this preferred embodiment, the signal level at a specific frequency is sufficiently decreased and a desired signal level is secured within the transmission band or the reception band of the surface acoustic wave filter. In addition, the so-called rebounding of the signal level, which is caused by suppressing the signal level at the specific frequency, is able to be reduced outside the band. Thus, the attenuation characteristics outside the band of the surface acoustic wave filter are able to be improved while maintaining appropriate attenuation characteristics within the band. Accordingly, it is possible to reduce the occurrence of a case in which unwanted noise is contained in a transmission signal and to reduce the influence of unwanted noise when the unwanted noise is contained in a reception signal.

In the preferred embodiment described above, the parallel arm resonator 16 of the first filter 10 is preferably used as a trap, but a parallel arm resonator that defines and functions as a trap may be provided to the second filter 20. In this case, the second filter 20 corresponds to a surface acoustic wave filter according to a preferred of the present invention. Further, a parallel arm resonator that defines and functions as a trap may be provided to each of the first filter 10 and the second filter 20.

Modified examples of preferred embodiments of the present invention are described below. In the preferred embodiment described above, description is given of the duplexer 1 that preferably includes the first filter 10 including the parallel arm resonator that defines and functions as a trap. However, the use of the surface acoustic wave filter according to this preferred embodiment is not limited to the duplexer. For example, the surface acoustic wave filter according to this preferred embodiment may be used for a multiplexer. The multiplexer performs transmission, reception, or both of transmission and reception of signals in a plurality of frequency bands. The surface acoustic wave filter according to this preferred embodiment may be used as any of a transmission-side filter and/or a reception-side filter of the multiplexer. Further, in the parallel arm resonator that defines and functions as a trap, the distance X between the IDT electrode portion and the reflector may be changed as appropriate so as to suppress a different frequency.

Thus, in the multiplexer that performs transmission, reception, or both of transmission and reception of signals in a plurality of frequency bands, the attenuation characteristics outside the bands is able to be improved while maintaining appropriate attenuation characteristics within the bands. Accordingly, it is possible to reduce the occurrence of a case in which unwanted noise is contained in a transmission signal and to reduce the influence of unwanted noise when the unwanted noise is contained in a reception signal.

For example, the multiplexer may be a quadruplexer including two filters corresponding to two kinds of transmission frequency bands and two filters corresponding to two kinds of reception frequency bands.

Other Preferred Embodiments

The present invention is not limited to the structures described in the preferred embodiments and modifications thereof described above. For example, the present invention may be modified as appropriate as described in the following modified examples.

For example, in the preferred embodiments described above, the surface acoustic wave filter preferably is the filter having a pass band of about 700 MHz to about 3 GHz, for example, but is not limited thereto. The surface acoustic wave filter may be a filter having another frequency band as a reception band. Further, the surface acoustic wave filter may be any of a reception filter and a transmission filter, or may be a transmission/reception filter capable of performing both of transmission and reception.

In the preferred embodiments described above, the parallel arm resonator defining and functioning as a trap is provided at the transmission-side filter which is a ladder filter, but is not limited thereto. The parallel arm resonator defining and functioning as a trap may be provided at a reception-side filter. Further, the parallel arm resonator defining and functioning as a trap is not limited to providing at the ladder filter, and may be provided at another type of filter. Still further, the trap is not limited to the parallel arm resonator, and may be a series arm resonator or other elements.

In addition, the present invention encompasses preferred embodiments attained by making various modifications conceivable by a person skilled in the art to the preferred embodiments and the modified examples described above, or preferred embodiments attained by combining any of the constituent elements and functions of the preferred embodiments and the modified examples described above without departing from the spirit of the present invention.

Preferred embodiments of the present invention are applicable to, for example, a multiplexer, a transmission device, or a reception device that uses a surface acoustic wave filter, or other communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter comprising:
   at least one series arm resonator; and
   at least one parallel arm resonator; wherein
   the at least one parallel arm resonator includes:
      an interdigital transducer (IDT) electrode including a pair of comb-shaped electrodes; and
      reflectors provided on both sides of the IDT electrode; wherein
   the pair of comb-shaped electrodes each include a busbar electrode and a plurality of first electrode fingers that are connected to the busbar electrode and are parallel or substantially parallel to each other, and are arranged so that the first electrode fingers of one of the pair of comb-shaped electrodes and the first electrode fingers of another one of the pair of comb-shaped electrodes are alternately located in a propagation direction of a surface acoustic wave;
   the reflectors each include a plurality of second electrode fingers that are parallel or substantially parallel to each other, and are provided on both sides of the IDT electrode portion in the propagation direction of the surface acoustic wave so that the second electrode fingers are parallel or substantially parallel to the first electrode fingers; and a distance between the first electrode finger and the second electrode finger which are proximate to each other is about 10% or more and about 20% or less of a main pitch of the first electrode fingers.

2. The surface acoustic wave filter according to claim 1, wherein the at least one parallel arm resonator is a trap that provides an attenuation pole at a frequency outside a band of the surface acoustic wave filter.

3. The surface acoustic wave filter according to claim 1, wherein the at least one series arm resonator and the at least one parallel arm resonator define a ladder filter.

4. The surface acoustic wave filter according to claim 1, wherein the at least one series arm resonator includes four series arm resonators and the at least one parallel arm resonator includes four parallel arm resonators.

5. The surface acoustic wave filter according to claim 1, wherein each of the comb-shaped electrodes includes a close contact layer and a main electrode layer.

6. The surface acoustic wave filter according to claim 1, wherein a duty ratio of the IDT electrode is about 0.5.

7. The surface acoustic wave filter according to claim 1, wherein a distance between the IDT electrode and one of the reflectors is equal or substantially equal to a distance between one of the first electrode fingers of one of the pair of comb-shaped electrodes and another one of the first electrode fingers of another one of the pair of comb-shaped electrodes.

8. The surface acoustic wave filter according to claim 7, wherein the distance between the one of the first electrode fingers of one of the pair of comb-shaped electrodes and the another one of the first electrode fingers of another one of the pair of comb-shaped electrodes is about 0.25 × the main pitch of the first electrode fingers.

9. The surface acoustic wave filter according to claim 1, wherein a protective layer covers the comb-shaped electrodes and the reflectors.

10. The surface acoustic wave filter according to claim 1, wherein each of the comb-shaped electrodes include a single metal film layer.

11. The surface acoustic wave filter according to claim 1, wherein the at least one series arm resonator and the at least one parallel arm resonator have a same structure.

12. A duplexer comprising the surface acoustic wave filter according to claim 1.

13. The duplexer according to claim 12, wherein the duplexer permits a surface acoustic wave within a frequency band of about 700 MHz to about 3GHz to pass therethrough.

14. The duplexer according to claim 12, wherein the duplexer includes a first filter and a second filter, and the first filter is defined by the surface acoustic wave filter.

15. The duplexer according to claim 14, wherein the first filter is a transmission filter and the second filter is a reception filter.

16. The duplexer according to claim 14, wherein the at least one parallel arm resonator is a trap that provides an attenuation pole at a frequency outside a band of the surface acoustic wave filter.

17. The duplexer according to claim 14, wherein the series arm resonator and the parallel arm resonator define a ladder filter.

18. The duplexer according to claim 14, wherein the at least one series arm resonator includes four series arm resonators and the at least one parallel arm resonator includes four parallel arm resonators.

19. A multiplexer comprising the surface acoustic wave filter according to claim 1.

20. The multiplexer according to claim 19, wherein the multiplexer is a quadplexer.

* * * * *